US011080640B1

(12) United States Patent
Carricato et al.

(10) Patent No.: US 11,080,640 B1
(45) Date of Patent: Aug. 3, 2021

(54) SYSTEMS AND METHODS FOR MANAGING ORGANIZATIONAL STRUCTURES

(71) Applicant: Accenture Global Solutions Limited, Dublin (IE)

(72) Inventors: Guido Carricato, Brooklyn, NY (US); Alastair Kent McMillan, London (GB); Roger Mark Ellison, Hertfordshire (GB); Ritvik Bhawan, Fleet (GB); Paul Eric Jeruchimowitz, Brooklyn, NY (US); Robert Arthur Rubin, Minneapolis, MN (US); Mithuna Shree Bhatt, Blacksburg, VA (US); Tina Marie Schimmenti, New York, NY (US)

(73) Assignee: ACCENTURE GLOBAL SOLUTIONS LIMITED, Dublin (IE)

( * ) Notice: Subject to any disclaimer, the term of this patent is extended or adjusted under 35 U.S.C. 154(b) by 0 days.

(21) Appl. No.: 16/823,089

(22) Filed: Mar. 18, 2020

Related U.S. Application Data

(63) Continuation of application No. 16/782,753, filed on Feb. 5, 2020.

(51) Int. Cl.
*G06Q 10/00* (2012.01)
*G06Q 10/06* (2012.01)
(Continued)

(52) U.S. Cl.
CPC ..... *G06Q 10/06375* (2013.01); *G06F 16/288* (2019.01); *G06F 30/27* (2020.01);
(Continued)

(58) Field of Classification Search
None
See application file for complete search history.

(56) References Cited

U.S. PATENT DOCUMENTS 5,551,880 A * 9/1996 Bonnstetter ............ G06Q 99/00
434/236
5,684,964 A * 11/1997 Powers ............ G06Q 10/06375
705/7.42
(Continued)

OTHER PUBLICATIONS

Yousef, Darwish A. "The Interactive Effects of Role Conflict and Role Ambiguity on Job Satisfaction and Attitudes Toward Organizational Change: A Moderated Multiple Regression Approach." International Journal of Stress Management 7.4 (2000). (Year: 2000).*

(Continued)

*Primary Examiner* — Gurkanwaljit Singh
(74) *Attorney, Agent, or Firm* — Brinks Gilson & Lione

(57) ABSTRACT

Systems and methods are provided for managing organizational or corporate structures, including the employee roles or activities administered by human resources. A portion of the role datasets received within human resource records may be used to generate role tokens comprising unique datasets that have been truncated and deduped. Such tokens may be extracted based on assigned prioritization scores, and further assigned training labels representing categorical levels. Predictive labels may be assigned to a remaining portion of the extracted tokens via a logistic regression classifier, and a model organizational dataset may be generated based on the assigned training labels and the assigned predictive labels. The prediction certainty of the role tokens in the model organizational dataset may be used to map the identified role tokens to the roles represented in the human resource records.

20 Claims, 3 Drawing Sheets

(51) Int. Cl.
*G06F 40/284* (2020.01)
*G06Q 10/10* (2012.01)
*G06N 5/04* (2006.01)
*G06N 7/00* (2006.01)
*G06F 16/28* (2019.01)
*G06N 20/00* (2019.01)
*G06N 5/02* (2006.01)
*G06F 30/27* (2020.01)
*G06K 9/62* (2006.01)
*G06N 3/08* (2006.01)
*G06N 3/04* (2006.01)

(52) U.S. Cl.
CPC ......... *G06F 40/284* (2020.01); *G06K 9/6257* (2013.01); *G06K 9/6259* (2013.01); *G06N 5/022* (2013.01); *G06N 5/04* (2013.01); *G06N 7/005* (2013.01); *G06N 20/00* (2019.01); *G06Q 10/067* (2013.01); *G06Q 10/063118* (2013.01); *G06Q 10/105* (2013.01); *G06N 3/0427* (2013.01); *G06N 3/08* (2013.01)

(56) References Cited

U.S. PATENT DOCUMENTS

| | | | | |
|---|---|---|---|---|
| 7,103,524 | B1* | 9/2006 | Teig | G06F 30/398 703/14 |
| 7,848,970 | B2 | 12/2010 | Kane et al. | |
| 7,908,189 | B2 | 3/2011 | Chan et al. | |
| 7,930,195 | B2 | 4/2011 | Heyns et al. | |
| 7,945,472 | B2* | 5/2011 | Pappas | G06Q 10/0637 705/7.31 |
| 8,639,596 | B2 | 1/2014 | Chew | |
| 8,874,477 | B2* | 10/2014 | Hoffberg | G06Q 10/103 705/37 |
| 9,336,268 | B1* | 5/2016 | Moudy | G06F 16/24578 |
| 9,495,642 | B1* | 11/2016 | Smith | G06F 16/248 |
| 9,818,067 | B2 | 11/2017 | Miranda et al. | |
| 10,388,179 | B2* | 8/2019 | Mosher | G09B 7/10 |
| 2002/0091597 | A1 | 7/2002 | Teng | |
| 2004/0091841 | A1* | 5/2004 | Buchtel | G09B 19/18 434/107 |
| 2006/0282306 | A1* | 12/2006 | Thissen-Roe | G06Q 10/06 705/7.14 |
| 2007/0087756 | A1* | 4/2007 | Hoffberg | G06Q 20/40 455/450 |
| 2010/0017487 | A1 | 1/2010 | Patinkin | |
| 2010/0250409 | A1 | 9/2010 | Savage et al. | |
| 2010/0317420 | A1* | 12/2010 | Hoffberg | G07F 17/323 463/1 |
| 2012/0330869 | A1* | 12/2012 | Durham | G06N 5/022 706/16 |
| 2013/0024407 | A1 | 1/2013 | Thompson et al. | |
| 2014/0279384 | A1 | 9/2014 | Loevenich | |
| 2016/0300135 | A1* | 10/2016 | Moudy | G06F 40/30 |
| 2016/0335260 | A1 | 11/2016 | Convertino et al. | |
| 2017/0132866 | A1 | 5/2017 | Kuklinski et al. | |
| 2017/0287348 | A1* | 10/2017 | Mosher | G06N 5/022 |
| 2019/0066011 | A1* | 2/2019 | Portnoy | G06Q 10/067 |
| 2019/0102741 | A1* | 4/2019 | Gupta | G06Q 10/0635 |
| 2019/0188742 | A1* | 6/2019 | Vasudevan | G06Q 10/063112 |
| 2020/0225655 | A1* | 7/2020 | Cella | G06N 3/0472 |

OTHER PUBLICATIONS

Jodlbauer, Susanne, et al. "The relationship between job dissatisfaction and training transfer." International Journal of Training and Development 16.1 (2012): 39-53. (Year: 2012).*
Cooper-Thomas, Helena D., Jessica Xu, and Alan M. Saks. "The differential value of resources in predicting employee engagement." Journal of Managerial Psychology (2018). (Year: 2018).*
Edgar, Fiona, and Alan Geare. "HRM practice and employee attitudes: different measures-different results." Personnel Review 34.5 (2005): 534-549. (Year: 2005).*
Ajeddini, K. (2016). Analyzing the influence of learning orientation and innovativeness on performance of public organizations: The case of iran. The Journal of Management Development, 35(2), 134-153 (Year: 2016).*
Hasan, Mostafa Monzur. "Organization capital and firm life cycle." Journal of Corporate Finance 48 (2018): 556-578. (Year: 2018).*

* cited by examiner

201 Truncate the text and values contained in the designated portion of the role dataset that corresponds to the designated set of role datafields, the truncated text or values having a format configured to match a standard taxonomy

202 Store the truncated text or values as a truncated role dataset

203 Dedupe the truncated text or values stored within the truncated role dataset

204 Store the deduped text or values as the adjusted unique role datasets contained in generated role tokens

SYSTEMS AND METHODS FOR MANAGING ORGANIZATIONAL STRUCTURES

CROSS REFERENCE TO RELATED APPLICATIONS

This application is a continuation of U.S. application Ser. No. 16/782,753, filed Feb. 5, 2020, which is incorporated herein by reference in its entirety.

TECHNICAL FIELD

This disclosure relates to management systems and methods, and, more particularly, to systems and methods for managing organizational structures.

BACKGROUND

Employee information stored in organizational systems frequently fail to identify the specific activities and tasks performed by the employees. Although organization charts illustrate high-level relationships between departments and employees, such diagrams are often silent about their routine or daily duties. Systems for managing employee records may suffer from inaccurate data classification and the inability to benchmark organizational structures, analyze alternative design models, and detect hidden relationships between employee activities.

Basic techniques and equipment for machine learning and natural language processing are known in the art. While enterprise systems have access to large volumes of information, existing analytical applications and data warehousing systems may not be able to fully utilize human resource records in a reasonable amount of time. Employee information is often aggregated into large data warehouses without the inclusion of an added layer of relationship data connecting the information. Such aggregation of large amounts of data, without contextual or relational information, are data dumps that are not useful.

Information stored in their original format in data warehouses often require large amounts of computing resources to transform the information into searchable data in order to respond to queries. Such conventional approaches are limited in their ability to identify and return queried data, and most of the stored data is not easily configured for machine learning analytics to provide a complete picture of knowledge and data in the enterprise. A machine learning architecture is desired to more efficiently and effectively identify predict optimal organizational structures.

BRIEF DESCRIPTION OF THE DRAWINGS

The foregoing and other objects, features, and advantages for embodiments of the present disclosure will be apparent from the following more particular description of the embodiments as illustrated in the accompanying drawings, in which reference characters refer to the same parts throughout the various views. The drawings are not necessarily to scale, emphasis instead being placed upon illustrating principles of the present disclosure.

FIG. 2 is a flow diagram illustrating an example of a method implemented by the system depicted in FIG. 1 for generating role tokens that are truncated and deduped, in accordance with certain embodiments of the present disclosure.

DETAILED DESCRIPTION

Reference will now be made in detail to the embodiments of the present disclosure, examples of which are illustrated in the accompanying drawings.

Figure 1:
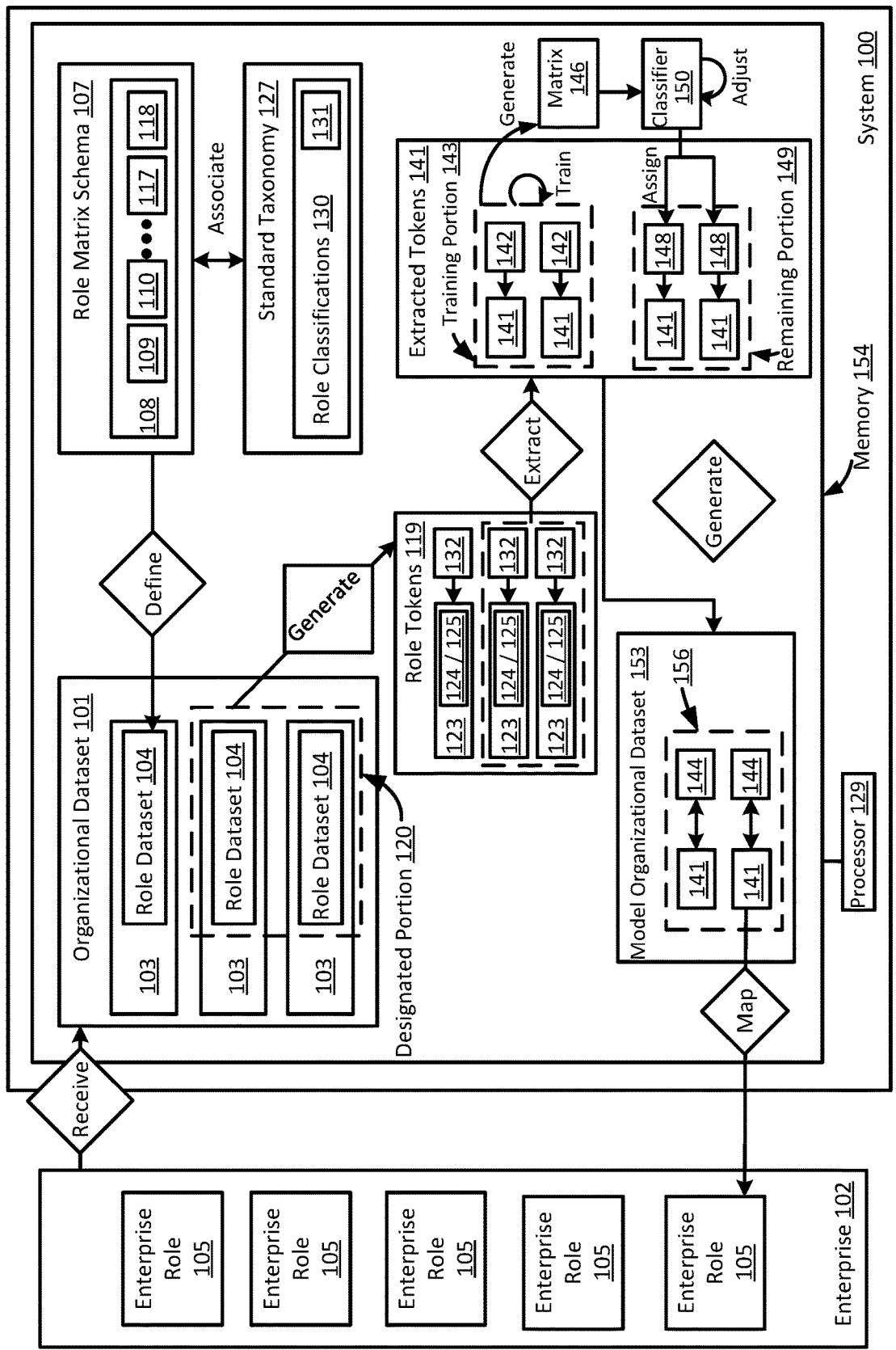
FIG. 1 is a block diagram illustrating an embodiment of a system, in accordance with certain embodiments of the present disclosure.

The present disclosure may be embodied in various forms, including a system, a method, a computer readable medium, or a platform-as-a-service (PaaS) product for managing organizational structures. As shown in FIG. 1, organizational datasets 101 may be received by a system 100, in accordance with certain embodiments. The received organizational datasets 101 may represent an organizational structure for an organization, corporation or enterprise 102. The received organizational datasets 101 may be received from the enterprise 102 and may include human resource records 103. Each human resource record 103 may include a role dataset 104, which may represent an enterprise role 105 for the enterprise 102, as well as additional historic information concerning the represented enterprise role 105.

In some embodiments, each role dataset 104 of the human resource records 103 may have an enterprise taxonomy or format that may be defined by a role matrix schema 107. In an embodiment, each role dataset 104 of the human resource record 103, or a portion thereof, may correspond to the role matrix schema 107. The role matrix schema 107 may include role datafields 108. The role datafields 108 may include, for example: a role title 109, a role family 110, a role description 111, a role activity 112, a business function 113, a sub-function 114, an outsource location 115, a role time 116, a role budget 117, or a role compensation 118. In accordance with certain embodiments, the role matrix schema 107 may include any combination of such role datafields 108, as indicated by the three-dot ellipsis shown in FIG. 1.

Role tokens 119 may be generated based on a designated portion 120 of the role dataset 104. The designated portion 120 of the role dataset 104 may correspond to a designated set of the role datafields 108. In an embodiment, the designated set of role datafields 108 may be designated via a user interface. In some embodiments, the designated set of role datafields 108 may be predetermined. The generated role tokens 119 may include adjusted unique role datasets 123, which may include text 124 or values 125 contained in the designated portion 120 of the role dataset 104 that are truncated and deduped.

In certain embodiments, as illustrated in FIG. 2, the presently disclosed method or system 100 may truncate the text 124 or values 125 contained in the designated portion 120 of the role dataset 104 that corresponds to the designated set of role datafields 108. See block 201 in FIG. 2. The truncated text 124 or values 125 may have a format configured to match the standard taxonomy 127. The text 124 or values 125 may be truncated via a natural language processing method implemented by the processor 129. The natural language processing method may be a spaCy method, a natural language toolkit (NLTK), or a regular expressions (Re) method. The truncated text 124 or values 125 may be stored as a truncated role dataset 104. See block 202. The presently disclosed method or system 100 may further dedupe the truncated text 124 or values 125 that are stored within the truncated role dataset 104. See block 203. The deduped text 124 or values 125 may be stored as the adjusted unique role datasets 123 contained in the generated role tokens 119. See block 204.

Referring back to FIG. 1, the designated set of role datafields 108 of the role matrix schema 107 may be associated with, or mapped to, role classifications 130 of a standard taxonomy 127. In an embodiment, each of the role classifications 130 may include a predetermined prediction certainty 131. Associations are illustrated by a double-headed arrow in FIG. 1. Each role datafield 108 may have a corresponding prediction certainty 131, which may be based on the predetermined prediction certainty 131 for a corresponding role classification 130.

In some embodiments, prioritization scores 132 may be assigned to the generated role tokens 119 using a hierarchical clustering method and a statistical modelling method. In certain embodiments, the hierarchical clustering method may be a Hierarchical Density-Based Spatial Clustering of Applications with Noise (HDBSCAN) method, and the statistical modelling method may be a topic modelling method. In an embodiment, the prioritization score 132 for each of the generated role tokens 119 may be based on role occurrences in the human resource record 103 of the role datasets 104. The prioritization score 132 for each of the generated role tokens 119 may be further based on the predetermined prediction certainties 131.

In certain embodiments, the presently disclosed method or system 100 may include an user interface configured to receive a training sample size, a training cycle count, a threshold prediction certainty, and a prediction iterations count. Combination of such information may be received via the user interface, in accordance with certain embodiments. In some embodiments, this information may be predetermined by the system 100.

The generated role tokens 119 that have threshold prioritization scores 132 may be extracted. In some embodiments, the generated role tokens 119 having the threshold prioritization scores 132 may include the role tokens 119 generated from the role datasets 104 that have one of the role occurrences in the human resource record 103 above a threshold role occurrence, which may be predetermined. In certain embodiments, the generated role tokens 119 having the threshold prioritization scores 132 may include the role tokens 119 corresponding to the associated role datafields 108 with the corresponding prediction certainties 132 below the threshold prediction certainty. In an embodiment, the extracted tokens 141 may include those generated tokens 119 that satisfy both of these criteria.

Training labels 142 may be assigned to a training portion 143 of the extracted tokens 141, in accordance with certain embodiments. In some embodiments, the training labels 142 may be assigned to the extracted tokens 141 in the training portion 143 based on the prioritization score 132 assigned to the generated role tokens 119. This training process may repeat for a predetermined number of training cycles. In an embodiment, the training process may depend on the hierarchical clustering method and the statistical modelling method that is used to assign the prioritization scores 132 to the role tokens 119. The training labels 142 may represent a categorical level 144 associated with the extracted tokens 141 in the training portion 143. The training portion 143 may be defined by the training sample size. The training labels 142 may be repeatedly assigned to the training portion 143 in one or more training cycles. The training cycles may be defined by the training cycle count.

In some embodiments, a matrix 146 may be generated based on the training portion 143 of the extracted tokens 141. The matrix 146 may be a sparse matrix 146. The assigned training labels 142 for the training portion 143 may be assigned to token elements in the sparse matrix. Predictive labels 148 may be assigned to a remaining portion 149 of the extracted tokens 141 via a logistic regression classifier (LRC) 150 based on model parameters and the sparse matrix 146.

In an embodiment, each of the predictive labels 148 may represent the categorical level 144 associated with the extracted tokens 141 in the remaining portion 149. Each of the predictive labels 148 may include an assigned prediction certainty 131, which may be generated by the logistic regression classifier 150. The predictive labels 148 may be repeatedly assigned by the logistic regression classifier 150 to each one of the extracted tokens 141 in the remaining portion 149, for one or more prediction iterations. The prediction iterations may be based on the prediction iterations count. The prediction iterations for an extracted token 141 may terminate if the assigned prediction certainty 131 for the extracted token 141 is above the threshold prediction certainty. In an embodiment, the model parameter of the logistic regression classifier 150 may be adjusted after each of the prediction iterations.

A model organizational dataset 153 may be generated based on the assigned training labels 142 and the assigned predictive labels 148. The model organizational dataset 153 may include the extracted tokens 141. Each of the extracted tokens 141 may be associated with one or more categorical level 144. In certain embodiments, the presently disclosed method or system 100 may adjust the extracted tokens 141 in the model organizational dataset 153 that are associated with more than one categorical levels 144 and a flagged categorical level 144. The flagged categorical level 144 of an extracted token 141 may be different from the first categorical level 144 that was associated with the extracted token 141. The adjusted token 141 may have an adjusted categorical level 144. The model organizational dataset 153 may be stored in a memory 154, which may be adapted to communicate with the processor 129 of the system 100. In an embodiment, the memory 154 may also store the received organizational dataset 101, the role matrix schema 107, the standard taxonomy 127, the generated role tokens 119, and the extracted tokens 141.

A prediction certainty median may be determined based on the assigned prediction certainties 131 of the extracted tokens 141 in the model organizational dataset 153. In accordance with certain embodiments, the presently disclosed method or system 100 may identify the extracted tokens 141 in the model organizational dataset 153 having assigned prediction certainties 131 greater than the prediction certainty median. Further, each of the enterprise roles 105 represented in the human resource records 103 may be mapped to, or associated with, the identified role tokens 156. In an embodiment, the identified role tokens 156 may include a role activity for the associated enterprise roles 105. The role activity may represent activities, routine tasks or daily duties performed by the enterprise role 105.

Figure 3:
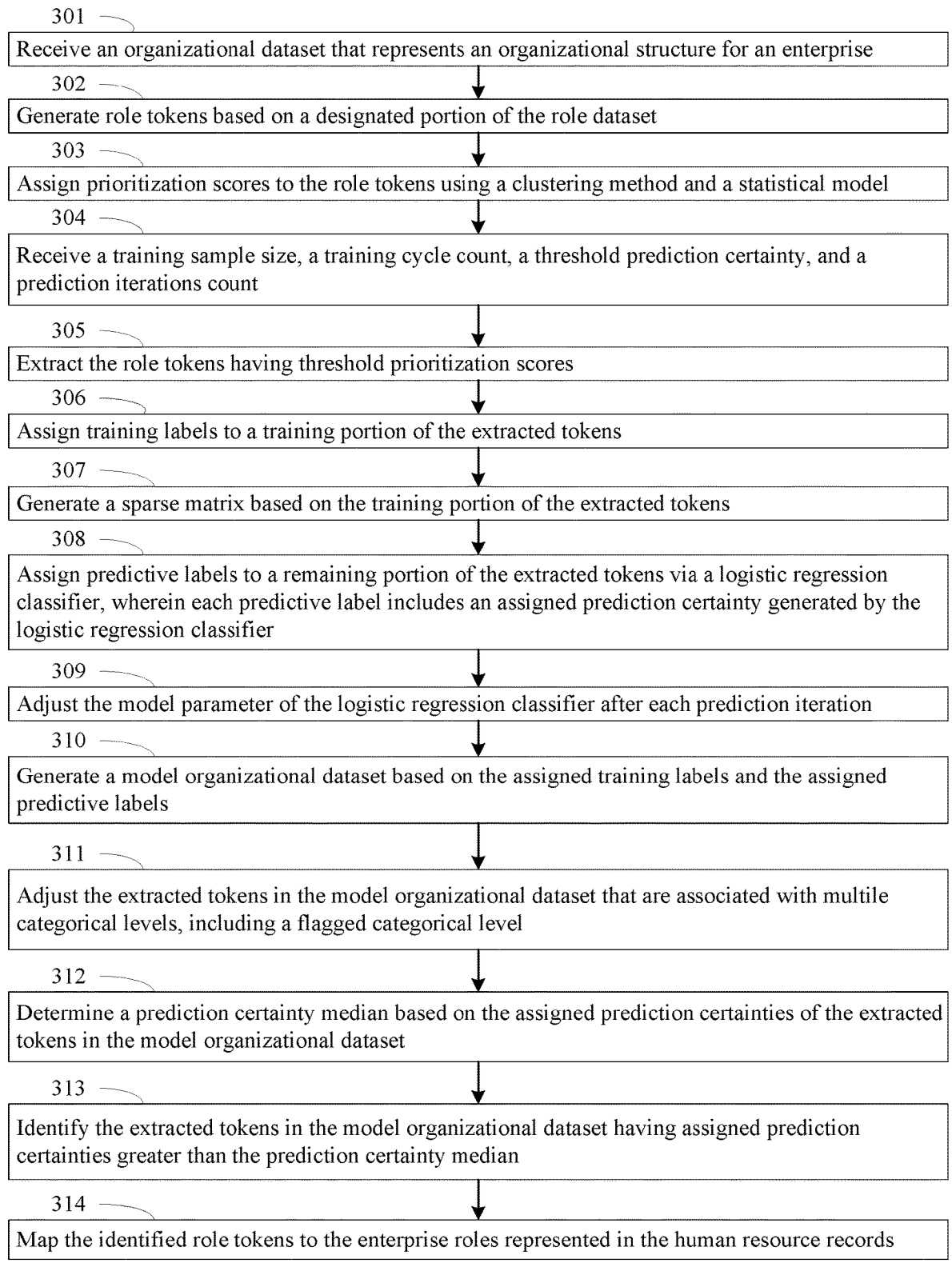
FIG. 3 is a flow diagram illustrating an example of a method implemented by the system depicted in FIG. 1 for, among other things, generating a model organizational dataset based on employee data received from an enterprise and mapping the role tokens contained in the model organizational dataset to enterprise roles for the enterprise, in accordance with certain embodiments of the present disclosure.

FIG. 3 illustrates a flowchart illustrating exemplary steps of a process or method for managing organizational structures, as implemented in accordance with certain embodiments. The processes described herein may be implemented by the system 100 shown in FIG. 1, a computer readable medium, a PaaS product, and/or circuitry components as described herein. In such embodiments, the method may include the step of receiving an organizational dataset 101 that represents an organizational structure for an enterprise 102. See block 301 in FIG. 3. The received datasets 101 may include human resource records 103. Each human resource record 103 may include a role dataset 104 that represents an enterprise role 105 for the enterprise 102.

In certain embodiments, the method may include the step of generating role tokens 119 based on at least a designated portion 120 of the role dataset 104. See block 302. The generated role tokens 119 may include adjusted unique role datasets 123 having text 124 and/or values 125 contained in the designated portion 120 of the role dataset 104 that are truncated and deduped. The method may further include the following steps: assigning prioritization scores 132 to the generated role tokens 119 using a hierarchical clustering method and a statistical modelling method (block 303); receiving, via a user interface, a training sample size, a training cycle count, a threshold prediction certainty, and a prediction iterations count (block 304); extracting the generated role tokens 119 having threshold prioritization scores 132 (block 305); and, assigning training labels 142 to a training portion 143 of the extracted tokens 141 (block 306).

In some embodiments, the training labels 142 may represent a categorical level 144 associated with the extracted tokens 141 in the training portion 143. The training portion 143 may be defined by the training sample size. The training labels 142 may be repeatedly assigned to the training portion 143 in one or more training cycles. The training cycles may be defined by the training cycle count. In certain embodiments, the training labels 142 may assigned to the extracted tokens 141 in the training portion 143 based on the hierarchical clustering method and the statistical modelling method used to assign the prioritization score 132 assigned to the generated role tokens 119.

The method may include the step of generating a matrix 146 based on the training portion 143 of the extracted tokens 119, in accordance with certain embodiments. See block 307. The assigned training labels 142 for the training portion 143 may be assigned to token elements in the matrix 146. In addition, the method may include the step of assigning predictive labels 148 to a remaining portion 149 of the extracted tokens 119 via a logistic regression classifier 150. See block 308. This may be based on model parameters and/or the matrix 146. In an embodiment, the matrix 146 may be a sparse matrix 146.

Each of the predictive labels 148 may represent the categorical level 144 associated with the extracted tokens 141 in the remaining portion 149. Each of the predictive labels 148 may include an assigned prediction certainty 131 generated by the logistic regression classifier 150. The predictive labels 148 may be repeatedly assigned by the logistic regression classifier 150 to each one of the extracted tokens 141 in the remaining portion 149 for one or more prediction iterations. The prediction iterations may be based on the prediction iterations count. The prediction iterations for at least one of the extracted tokens 141 may terminate if the assigned prediction certainty 131 for the at least one of the extracted tokens 141 is above the threshold prediction certainty.

The method may further include the step of adjusting the model parameter of the logistic regression classifier 150 after each of the prediction iterations. See block 309. In certain embodiments, the method may include the generation of a model organizational dataset 153 based on the assigned training labels 142 and the assigned predictive labels 148. See block 310. The model organizational dataset 153 may include the extracted tokens 141. Each of the extracted tokens 141 may be associated with one or more categorical levels 144. In some embodiments, the method may include the step of adjusting the extracted tokens 141 in the model organizational dataset 153 that are associated with more than one of the one or more categorical levels 144 and at least one flagged categorical level 144. See block 311. The flagged categorical level 144 of one of the extracted tokens 141 may be different from the first categorical level 144 associated with the one of the extracted tokens 141. Accordingly, the adjusted token 141 may have an adjusted categorical level 144.

In certain embodiments, a prediction certainty median may be determined based on the assigned prediction certainties 131 of the extracted tokens 141 in the model organizational dataset 153. See block 312. The method may further include the step of identifying the extracted tokens 141 in the model organizational dataset 153 having assigned prediction certainties 131 greater than the prediction certainty median. See block 313. In addition, the method may include the step of mapping or associating the identified role tokens 156 to the enterprise roles 105 represented in the human resource records 103. See block 314. The identified role tokens 156 may include a role activity for the associated enterprise roles 105. The mapping process may include the association of the identified role tokens 156 to the role datasets 104 in the received organizational datasets 101, which represent the enterprise roles 105 for the enterprise 102. In an embodiment, the mapping process may also include the transmission of the identified role tokens 156, and/or the entire model organizational dataset 153, to the enterprise 102 via an user interface.

In certain embodiments, the presently disclosed method or system 100 may identify human resources cost savings associated with an associated enterprise role 105 based on a compensation comparison of a role dataset 104 in the human resource records 103 of the received organizational datasets 101 with the associated enterprise role 105. The compensation comparison may be based on the role compensation 118 for the role dataset 104 and the associated enterprise roles 105. Similarly, the present disclosure may enable the identification of human resources budget reductions associated with the associated enterprise role 105 based on a budget comparison of the role dataset 104 with the associated enterprise role 105. The budget comparison may be based on the role budget 117 for the role dataset 104 and the associated enterprise role 105. The disclosed system may also be configured to identify human resources outsource savings associated with the associated enterprise role 105 based on an outsource comparison of the role dataset 104 with the associated enterprise roles 105. The outsource comparison may be based on the outsource location 115 for the role dataset 104 and the associated enterprise role 105.

In an embodiment, an accountability matrix may be generated based on the associated enterprise roles 105. A role ownership may be identified for each of the enterprise roles 105 based on the accountability matrix. The role ownership may include the role family 110 for the identified role tokens 156. An employee identifier may be assigned to one of the role ownership. The employee identifier may represent an employee of the enterprise 102. Each of the enterprise roles 105 represented in the human resource records 103 may be mapped to, associated with, the identified role ownership 156. In some embodiments, a time-distribution categorical level may be mapped to, associated with, the extracted tokens 141. Time-distribution labels representing the time-distribution categorical levels may be assigned to the extracted tokens 141.

An optimization lever may be assigned to the extracted tokens 141, in accordance with certain embodiments. The optimization lever may be contained in the standard taxonomy 127. In an embodiment, the optimization lever may be one of the role classifications 130 of a standard taxonomy 127. The optimization lever may include a demand management lever, an automation lever, an operating model lever, an organization lever, or a reinvest lever. In some embodiments, a lever dataset may be assigned to the assigned optimization lever. The lever dataset may be received via the user interface. In some embodiments, the lever dataset may be predetermined. A lever-optimized sparse matrix may generated based on the lever-optimized tokens, i.e. the extracted token 141 that were assigned an optimization lever. Lever labels may be assigned to the lever-optimized tokens via the logistic regression classifier 150 based on the lever-optimized sparse matrix.

A lever-optimized organizational dataset may be generated based on the assigned lever labels. The lever-optimized organizational dataset may include the lever-optimized tokens. Each of the extracted tokens 141 may be associated with the optimization lever. In certain embodiments, the presently disclosed method or system 100 may map or associate each of the enterprise roles 105 represented in the human resource records 103 to the lever-optimized tokens. Further, the disclosed system 100 may identify lever-optimization savings associated with the optimization lever based on a lever-optimization comparison of a role dataset 104 in the human resource records 103 of the received organizational datasets 101 with the associated enterprise roles 105. The lever-optimization comparison may be based on the role compensation 118 for the role dataset 104 and the associated enterprise role 105. The enterprise roles 105 represented in the human resource records 103 may be adjusted based on the lever-optimized tokens.

The presently disclosed system 100 may be implemented in many different ways, using various components and modules, including any combination of circuitry described herein, such as hardware, software, middleware, application program interfaces (APIs), and/or other components for implementing the corresponding features of the circuitry. In an embodiment, the system 100 may include a computing device, which may include a memory 154 and a processor 129. The system 100 may also include generated graphical user interfaces (GUIs). As discussed below, users and administrators (admins) may interface with the system via these user interfaces. In some embodiments, the memory 154 may include the modules of the system 100.

In some embodiments, the computer device may include communication interfaces, system circuitry, input/output (I/O) interface circuitry, and display circuitry. The GUIs displayed by the display circuitry may be representative of GUIs generated by the system 100 to present a query to an application or end user. The GUIs displayed by the display circuitry may also be representative of GUIs generated by the system 100 to receive query inputs. The GUIs may be displayed locally using the display circuitry, or for remote visualization, e.g., as HTML, JavaScript, audio, and video output for a web browser running on a local or remote machine. The GUIs and the I/O interface circuitry may include touch sensitive displays, voice or facial recognition inputs, buttons, switches, speakers and other user interface elements. Additional examples of the I/O interface circuitry includes microphones, video and still image cameras, headset and microphone input/output jacks, Universal Serial Bus (USB) connectors, memory card slots, and other types of inputs. The I/O interface circuitry may further include magnetic or optical media interfaces (e.g., a CDROM or DVD drive), serial and parallel bus interfaces, and keyboard and mouse interfaces.

The communication interfaces may include wireless transmitters and receivers (herein, "transceivers") and any antennas used by the transmit-and-receive circuitry of the transceivers. The transceivers and antennas may support WiFi network communications, for instance, under any version of IEEE 802.11, e.g., 802.11n or 802.11ac, or other wireless protocols such as Bluetooth, Wi-Fi, WLAN, cellular (4G, LTE/A). The communication interfaces may also include serial interfaces, such as universal serial bus (USB), serial ATA, IEEE 1394, lighting port, $I^2C$, slimBus, or other serial interfaces. The communication interfaces may also include wireline transceivers to support wired communication protocols. The wireline transceivers may provide physical layer interfaces for any of a wide range of communication protocols, such as any type of Ethernet, Gigabit Ethernet, optical networking protocols, data over cable service interface specification (DOCSIS), digital subscriber line (DSL), Synchronous Optical Network (SONET), or other protocol.

The system circuitry may include any combination of hardware, software, firmware, APIs, and/or other circuitry. The system circuitry may be implemented, for example, with one or more systems on a chip (SoC), servers, application specific integrated circuits (ASIC), field programmable gate arrays (FPGA), microprocessors, discrete analog and digital circuits, and other circuitry. The system circuitry may implement any desired functionality of the system 100. As just one example, the system circuitry may include one or more instruction processor 129 and memory 154.

The processor 129 may be one or more devices operable to execute logic. The logic may include computer executable instructions or computer code embodied in the memory 154 or in other memory that when executed by the processor 129, cause the processor 129 to perform the features implemented by the logic. The computer code may include instructions executable with the processor 129. Logic, such as programs or circuitry, may be combined or split among multiple programs, distributed across several memories 154 and processors 129, and may be implemented in a library, such as a shared library (e.g., a dynamic link library or DLL).

The memory stores, for example, control instructions for executing the features of the disclosed system 100, as well as the operating system. Examples of the memory 154 may include non-volatile and/or volatile memory, such as a random access memory (RAM), a read-only memory (ROM), an erasable programmable read-only memory (EPROM), or flash memory. Alternatively or in addition, the memory 154 may include an optical, magnetic (hard-drive) or any other form of data storage device. In one implementation, the processor 129 executes the control instructions and the operating system to carry out any desired functionality for the disclosed system 100. The control parameters may provide and specify configuration and operating options for the control instructions, operating system, and other functionality of the computer device.

The computer device may further include various data sources, as described herein. Each of the databases that are included in the data sources may be accessed by the system 100 to obtain data for consideration during any one or more of the processes described herein. All of the discussion, regardless of the particular implementation described, is exemplary in nature, rather than limiting. For example, although selected aspects, features, or components of the implementations are depicted as being stored in memories, all or part of the system 100 may be stored on, distributed across, or read from other computer readable storage media, for example, secondary storage devices such as hard disks, flash memory drives, floppy disks, and CD-ROMs. Moreover, the various modules and screen display functionality is but one example of such functionality and any other configurations encompassing similar functionality are possible.

The respective logic, software or instructions for implementing the processes, methods and/or techniques discussed above may be provided on computer readable storage media. The functions, acts or tasks illustrated in the figures or described herein may be executed in response to one or more sets of logic or instructions stored in or on computer readable media. The functions, acts or tasks are independent of the particular type of instructions set, storage media, processor or processing strategy and may be performed by software, hardware, integrated circuits, firmware, micro code and the like, operating alone or in combination. Likewise, processing strategies may include multiprocessing, multitasking, parallel processing and the like. In one embodiment, the instructions are stored on a removable media device for reading by local or remote systems. In other embodiments, the logic or instructions are stored in a remote location for transfer through a computer network or over telephone lines. In yet other embodiments, the logic or instructions are stored within a given computer, central processing unit ("CPU"), graphics processing unit ("GPU"), or the system 100.

A second action may be said to be "in response to" a first action independent of whether the second action results directly or indirectly from the first action. The second action may occur at a substantially later time than the first action and still be in response to the first action. Similarly, the second action may be said to be in response to the first action even if intervening actions take place between the first action and the second action, and even if one or more of the intervening actions directly cause the second action to be performed. For example, a second action may be in response to a first action if the first action includes setting a Boolean variable to true and the second action is initiated if the Boolean variable is true.

While the present disclosure has been particularly shown and described with reference to an embodiment thereof, it will be understood by those skilled in the art that various changes in form and details may be made therein without departing from the spirit and scope of the present disclosure. Although some of the drawings illustrate a number of operations in a particular order, operations that are not order-dependent may be reordered and other operations may be combined or broken out. While some reordering or other groupings are specifically mentioned, others will be apparent to those of ordinary skill in the art and so do not present an exhaustive list of alternatives.

What is claimed is:

1. A method for managing organizational structures, comprising the steps of:
    receiving organizational datasets representing an organizational structure for an enterprise, the received datasets including human resource records, each human resource record including a role dataset representing an enterprise role for the enterprise;
    generating role tokens based on at least a designated portion of the role dataset, the generated role tokens including adjusted unique role datasets having text or values contained in the designated portion of the role dataset that are truncated and deduped;
    assigning prioritization scores to the generated role tokens using a hierarchical clustering method and a statistical modelling method;
    receiving, via an user interface, a training sample size, a training cycle count, a threshold prediction certainty, and a prediction iterations count;
    extracting the generated role tokens having threshold prioritization scores;
    assigning training labels to a training portion of the extracted tokens based on the assigned prioritization scores,
        the training labels representing a categorical level associated with the extracted tokens in the training portion,
        the training portion defined by the training sample size,
        the training labels repeatedly assigned to the training portion over one or more training cycles, and,
        the training cycles defined by the training cycle count;
    generating a matrix based on the training portion of the extracted tokens, wherein the assigned training labels for the training portion are assigned to token elements in the matrix;
    assigning predictive labels to a remaining portion of the extracted tokens via a logistic regression classifier based on model parameters and the matrix,
    wherein:
        the matrix is a sparse matrix,
        each of the predictive labels representing the categorical level associated with the extracted tokens in the remaining portion,
        each of the predictive labels including an assigned prediction certainty generated by the logistic regression classifier,
        the predictive labels are repeatedly assigned by the logistic regression classifier to each one of the extracted tokens in the remaining portion for one or more prediction iterations,
        the prediction iterations are based on the prediction iterations count, and
        the prediction iterations for at least one of the extracted tokens terminating if the assigned prediction certainty for the at least one of the extracted tokens is above the threshold prediction certainty;
    adjusting the model parameter of the logistic regression classifier after each of the prediction iterations;
    generating a model organizational dataset based on the assigned training labels and the assigned predictive labels, the model organizational dataset including the extracted tokens, each of the extracted tokens associated with one or more categorical levels; and,
    adjusting the extracted tokens in the model organizational dataset that are associated with more than one of the one or more categorical levels and at least one flagged categorical level,
    the flagged categorical level of one of the extracted tokens differing from the first categorical level associated with the one of the extracted tokens, the adjusted token having an adjusted categorical level.

2. The method of claim 1, further comprising the steps of:
    determining a prediction certainty median based on the assigned prediction certainties of the extracted tokens in the model organizational dataset;
    identifying the extracted tokens in the model organizational dataset having assigned prediction certainties greater than the prediction certainty median; and,
    associating each of the enterprise roles represented in the human resource records to the identified extracted tokens, wherein the identified extracted tokens include a role activity for the associated enterprise roles.

3. The method of claim 2, further comprising the steps of:
generating an accountability matrix based on the associated enterprise roles;
identifying a role ownership for each of the associated enterprise roles based on the accountability matrix, the role ownership including the role family for the identified extracted tokens;
assigning an employee identifier to one of the role ownership, the employee identifier representing an employee of the enterprise; and,
associating each of the enterprise roles represented in the human resource records to the identified role ownership.

4. The method of claim 2, wherein the human resource records having an enterprise taxonomy, the enterprise taxonomy defined by a role matrix schema, each role dataset of the human resource record corresponding to the role matrix schema, the role matrix schema selected from a group of role datafields consisting of a role title, a role family, a role description, the role activity, a business function, a sub-function, an outsource location, a role time, a role budget, and a role compensation; and, wherein the designated portion of the role dataset corresponds to a designated set of the role datafields, the designated set of role datafields designated via the user interface.

5. The method of claim 4, further comprising the steps of:
identifying human resources cost savings associated with at least one of the associated enterprise roles based on a compensation comparison of at least one of the role datasets in the human resource records of the received organizational datasets with the at least one of the associated enterprise roles, wherein the compensation comparison is based on the role compensation for the at least one of the role datasets and the at least one of the associated enterprise roles;
identifying human resources budget reductions associated with at least one of the associated enterprise roles based on a budget comparison of at least one of the role datasets in the human resource records of the received organizational datasets with the at least one of the associated enterprise roles, wherein the budget comparison is based on the role budget for the at least one of the role datasets and the at least one of the associated enterprise roles; and,
identifying human resources outsource savings associated with at least one of the associated enterprise roles based on an outsource comparison of at least one of the role datasets in the human resource records of the received organizational datasets with the at least one of the associated enterprise roles, wherein the outsource comparison is based on the outsource location for the at least one of the role datasets and the at least one of the associated enterprise roles.

6. The method of claim 4, further comprising the steps of:
truncating the text or values contained in the designated portion of the role dataset that corresponds to the designated set of role datafields, the truncated text or values have a format configured to match a standard taxonomy, the text or values are truncated via a natural language processing method implemented by a processor, the natural language processing method is selected from a group consisting of a spaCy method, a natural language toolkit (NLTK), and a regular expressions (Re) method;
storing the truncated text or values as a truncated role dataset;
deduping the truncated text or values stored within the truncated role dataset; and,
storing the deduped text or values as the adjusted unique role datasets contained in the generated role tokens.

7. The method of claim 4, wherein the generated role tokens having the threshold prioritization scores include the role tokens generated from the role datasets having one of a plurality of role occurrences in the human resource record above a threshold role occurrence, and wherein the generated role tokens having the threshold prioritization scores include the role tokens corresponding to the designated set of role datafields with the corresponding prediction certainties below the threshold prediction certainty.

8. The method of claim 4, further comprising the steps of:
assigning an optimization lever to the extracted tokens, the optimization lever contained in a standard taxonomy, the optimization lever comprising one of the role classifications of a standard taxonomy, the optimization lever selected from a group consisting of a demand management lever, an automation lever, an operating model lever, an organization lever, and a reinvest lever;
assigning a lever dataset to the assigned optimization lever, the lever dataset received from the user interface;
generating a lever-optimized matrix based on the lever-optimized tokens;
assigning lever labels to the lever-optimized tokens via the logistic regression classifier based on the lever-optimized matrix;
generating a lever-optimized organizational dataset based on the assigned lever labels, the lever-optimized organizational dataset including the lever-optimized tokens, each of the extracted tokens associated with the optimization lever;
associating each of the enterprise roles represented in the human resource records to the lever-optimized tokens;
identifying lever-optimization savings associated with the optimization lever based on a lever-optimization comparison of at least one of the role datasets in the human resource records of the received organizational datasets with the at least one of the associated enterprise roles, wherein the lever-optimization comparison is based on the role compensation for the at least one of the role datasets and the at least one of the associated enterprise roles; and,
adjusting the enterprise roles represented in the human resource records based on the lever-optimized tokens.

9. The method of claim 4, further comprising the steps of:
associating the designated set of role datafields of the role matrix schema with role classifications of a standard taxonomy, each of the role classifications including a predetermined prediction certainty, each one of the associated role datafields having a corresponding prediction certainty based on the predetermined prediction certainty for a corresponding role classification;
associating a time-distribution categorical level to the extracted tokens; and,
assigning time-distribution labels representing the time-distribution categorical levels,
wherein the hierarchical clustering method is a Hierarchical Density-Based Spatial Clustering of Applications with Noise (HDBSCAN) method, wherein the statistical modelling method is a topic modelling method, wherein the prioritization score for each of the generated role tokens is based on role occurrences in the human resource record of the role datasets, the prioritization score for each of the generated role tokens is further based on the predetermined prediction certainties.

10. A system for managing organizational structures, comprising:
a memory to store executable instructions; and,
a processor adapted to access the memory, the processor further adapted to execute the executable instructions stored in the memory to:
receive organizational datasets representing an organizational structure for an enterprise, the received organizational datasets including human resource records that are stored in the memory, each human resource record including a role dataset representing an enterprise role for the enterprise;
generate role tokens based on at least a designated portion of the role dataset, the generated role tokens including adjusted unique role datasets having text or values contained in the designated portion of the role dataset that are truncated and deduped, wherein the generated role tokens are stored in the memory;
assign prioritization scores to the generated role tokens using a hierarchical clustering method and a statistical modelling method;
receive, via an user interface, a training sample size, a training cycle count, a threshold prediction certainty, and a prediction iterations count;
extract the generated role tokens having threshold prioritization scores;
assign training labels to a training portion of the extracted tokens based on the assigned prioritization scores, the training labels representing a categorical level associated with the extracted tokens in the training portion, the training portion defined by the training sample size, the training labels repeatedly assigned to the training portion one or more training cycles, and the training cycles defined by the training cycle count;
generating a sparse matrix based on the training portion of the extracted tokens, wherein the assigned training labels for the training portion are assigned to token elements in the sparse matrix;
assign predictive labels to a remaining portion of the extracted tokens via a logistic regression classifier based on model parameters and the sparse matrix, each of the predictive labels representing the categorical level associated with the extracted tokens in the remaining portion, each of the predictive labels including an assigned prediction certainty generated by the logistic regression classifier, the predictive labels are repeatedly assigned by the logistic regression classifier to each one of the extracted tokens in the remaining portion for one or more prediction iterations, the prediction iterations are based on the prediction iterations count, and the prediction iterations for at least one of the extracted tokens terminating if the assigned prediction certainty for the at least one of the extracted tokens is above the threshold prediction certainty;
adjust the model parameter of the logistic regression classifier after each of the prediction iterations;
generate a model organizational dataset based on the assigned training labels and the assigned predictive labels, the model organizational dataset including the extracted tokens, each of the extracted tokens associated with one or more categorical levels; and,
adjust the extracted tokens in the model organizational dataset that are associated with more than one of the one or more categorical levels and at least one flagged categorical level, the flagged categorical level of one of the extracted tokens differing from the first categorical level associated with the one of the extracted tokens, the adjusted token having an adjusted categorical level.

11. The system of claim 10, wherein the processor is further adapted to:
determine a prediction certainty median based on the assigned prediction certainties of the extracted tokens in the model organizational dataset;
identify the extracted tokens in the model organizational dataset having assigned prediction certainties greater than the prediction certainty median; and,
associate each of the enterprise roles represented in the human resource records to the identified extracted tokens, wherein the identified extracted tokens include a role activity for the associate enterprise roles.

12. The system of claim 11, wherein the processor is further adapted to:
generate an accountability matrix based on the associated enterprise roles;
identify a role ownership for each of the enterprise roles based on the accountability matrix, the role ownership including the role family for the identified extracted tokens;
assign an employee identifier to one of the role ownership, the employee identifier representing an employee of the enterprise; and,
associate each of the enterprise roles represented in the human resource records to the identified role ownership.

13. The system of claim 11, wherein the human resource records having an enterprise taxonomy, the enterprise taxonomy defined by a role matrix schema, each role dataset of the human resource record corresponding to the role matrix schema, the role matrix schema selected from a group of role datafields consisting of a role title, a role family, a role description, the role activity, a business function, a subfunction, an outsource location, a role time, a role budget, and a role compensation; and, wherein the designated portion of the role dataset corresponds to a designated set of the role datafields, the designated set of role datafields designated via the user interface.

14. The system of claim 13, wherein the processor is further adapted to:
associate the designated set of role datafields of the role matrix schema with role classifications of a standard taxonomy, wherein the associated role datafields are stored in the memory, each of the role classifications including a predetermined prediction certainty, each one of the associated role datafields having a corresponding prediction certainty based on the predetermined prediction certainty for a corresponding role classification;
associate a time-distribution categorical level to the extracted tokens; and,
assign time-distribution labels representing the time-distribution categorical levels;
wherein, the hierarchical clustering method is a Hierarchical Density-Based Spatial Clustering of Applications with Noise (HDBSCAN) method, wherein the statistical modelling method is a topic modelling method,
wherein the prioritization score for each of the generated role tokens is based on role occurrences in the human resource record of the role datasets, the prioritization score for each of the generated role tokens is further based on the predetermined prediction certainties.

15. The system of claim 13, wherein the processor is further adapted to:
identify human resources cost savings associated with at least one of the associated enterprise roles based on a compensation comparison of at least one of the role datasets in the human resource records of the received organizational datasets with the at least one of the associated enterprise roles, wherein the compensation comparison is based on the role compensation for the at least one of the role datasets and the at least one of the associated enterprise roles;
identify human resources budget reductions associated with at least one of the associated enterprise roles based on a budget comparison of at least one of the role datasets in the human resource records of the received organizational datasets with the at least one of the associated enterprise roles, wherein the budget comparison is based on the role budget for the at least one of the role datasets and the at least one of the associated enterprise roles; and,
identify human resources outsource savings associated with at least one of the associated enterprise roles based on an outsource comparison of at least one of the role datasets in the human resource records of the received organizational datasets with the at least one of the associated enterprise roles, wherein the outsource comparison is based on the outsource location for the at least one of the role datasets and the at least one of the associated enterprise roles.

16. The system of claim 13, wherein the processor is further adapted to:
truncate the text or values contained in the designated portion of the role dataset that corresponds to the designated set of role datafields, wherein the truncated text or values have a format configured to match the standard taxonomy, wherein the text or values are truncated via a natural language processing method implemented by the processor, wherein the natural language processing method is selected from a group consisting of a spaCy method, a natural language toolkit (NLTK), and a regular expressions (Re) method;
store the truncated text or values in the memory as a truncated role dataset;
dedupe the truncated text or values stored within the truncated role dataset; and,
store the dedupped text or values in the memory as the adjusted unique role datasets contained in the generated role tokens.

17. The system of claim 13, wherein the generated role tokens having the threshold prioritization scores include the role tokens generated from the role datasets having one of the role occurrences in the human resource record above a threshold role occurrence, and wherein the generated role tokens having the threshold prioritization scores include the role tokens corresponding to the designated set of the role datafields with the corresponding prediction certainties below the threshold prediction certainty.

18. The system of claim 13, wherein the processor is further adapted to:
assign an optimization lever to the extracted tokens, the optimization lever contained in the standard taxonomy, the optimization lever comprising one of the role classifications of a standard taxonomy, the optimization lever selected from a group consisting of a demand management lever, an automation lever, an operating model lever, an organization lever, and a reinvest lever;
assign a lever dataset to the assigned optimization lever, the lever dataset received from the user interface;
generate a lever-optimized sparse matrix based on the lever-optimized tokens;
assign lever labels to the lever-optimized tokens via the logistic regression classifier based on the lever-optimized sparse matrix;
generate a lever-optimized organizational dataset based on the assigned lever labels, the lever-optimized organizational dataset including the lever-optimized tokens, each of the extracted tokens associated with the optimization lever;
associate each of the enterprise roles represented in the human resource records to the lever-optimized tokens;
identify lever-optimization savings associated with the optimization lever based on a lever-optimization comparison of at least one of the role datasets in the human resource records of the received organizational datasets with the at least one of the associated enterprise roles, wherein the lever-optimization comparison is based on the role compensation for the at least one of the role datasets and the at least one of the associated enterprise roles; and,
adjust the enterprise roles represented in the human resource records based on the lever-optimized tokens.

19. A non-transitory computer-readable medium including instructions configured to be executed by a processor, wherein the executed instructions are adapted to cause the processor to:
receive organizational datasets representing an organizational structure for an
enterprise, the received organizational datasets including human resource records that are stored in the memory, each human resource record including a role dataset representing an enterprise role for the enterprise;
generate role tokens based on at least a designated portion of the role dataset, the generated role tokens including adjusted unique role datasets having text or values contained in the designated portion of the role dataset that are truncated and deduped, wherein the generated role tokens are stored in the memory;
assign prioritization scores to the generated role tokens using a hierarchical clustering method and a statistical modelling method;
receive, via an user interface, a training sample size, a training cycle count, a threshold prediction certainty, and a prediction iterations count;
extract the generated role tokens having threshold prioritization scores;
assign training labels to a training portion of the extracted tokens based on the assigned prioritization scores, the training labels representing a categorical level associated with the extracted tokens in the training portion, the training portion defined by the training sample size, the training labels repeatedly assigned to the training portion one or more training cycles, and the training cycles defined by the training cycle count;
generating a sparse matrix based on the training portion of the extracted tokens, wherein the assigned training labels for the training portion are assigned to token elements in the sparse matrix;
assign predictive labels to a remaining portion of the extracted tokens via a logistic regression classifier based on model parameters and the sparse matrix, each of the predictive labels representing the categorical level associated with the extracted tokens in the remaining portion, each of the predictive labels including an assigned prediction certainty generated by the logistic regression classifier, the predictive labels are repeatedly assigned by the logistic regression classifier to each one of the extracted tokens in the remaining portion for one or more prediction iterations, the prediction iterations are based on the prediction iterations count, and the prediction iterations for at least one of the extracted tokens terminating if the assigned prediction certainty for the at least one of the extracted tokens is above the threshold prediction certainty;

adjust the model parameter of the logistic regression classifier after each of the prediction iterations;

generate a model organizational dataset based on the assigned training labels and the assigned predictive labels, the model organizational dataset including the extracted tokens, each of the extracted tokens associated with one or more categorical levels; and, adjust the extracted tokens in the model organizational dataset that are associated with more than one of the one or more categorical levels and at least one flagged categorical level, the flagged categorical level of one of the extracted tokens differing from the first categorical level associated with the one of the extracted tokens, the adjusted token having an adjusted categorical level.

20. The computer-readable medium of claim 19, wherein the executed instructions are further adapted to cause the processor to:

determine a prediction certainty median based on the assigned prediction certainties of the extracted tokens in the model organizational dataset;

identify the extracted tokens in the model organizational dataset having assigned prediction certainties greater than the prediction certainty median; and, associate each of the enterprise roles represented in the human resource records to the identified extracted tokens, wherein the identified extracted tokens include a role activity for the associate enterprise roles.

* * * * *